(12) United States Patent
Selverian et al.

(10) Patent No.: US 8,796,715 B2
(45) Date of Patent: Aug. 5, 2014

(54) PHOSPHOR BLEND FOR AN LED LIGHT SOURCE AND LED LIGHT SOURCE INCORPORATING SAME

(75) Inventors: John Selverian, North Reading, MA (US); Robert E. Levin, Salem, MA (US)

(73) Assignee: Osram Sylvania Inc., Danvers, MA (US)

( * ) Notice: Subject to any disclaimer, the term of this patent is extended or adjusted under 35 U.S.C. 154(b) by 225 days.

(21) Appl. No.: 13/388,953

(22) PCT Filed: Aug. 17, 2010

(86) PCT No.: PCT/US2010/045760
§ 371 (c)(1),
(2), (4) Date: Feb. 3, 2012

(87) PCT Pub. No.: WO2011/022399
PCT Pub. Date: Feb. 24, 2011

(65) Prior Publication Data
US 2012/0126253 A1    May 24, 2012

Related U.S. Application Data

(60) Provisional application No. 61/234,525, filed on Aug. 17, 2009.

(51) Int. Cl.
*H01L 33/00* (2010.01)
*H01L 33/50* (2010.01)
*C09K 11/77* (2006.01)
*C09K 11/08* (2006.01)

(52) U.S. Cl.
CPC .......... *C09K 11/7734* (2013.01); *H01L 33/504* (2013.01); *C09K 11/7774* (2013.01); *C09K 11/0883* (2013.01); *C09K 11/7728* (2013.01)

USPC 257/98; 257/99; 257/E33.061; 257/E31.129; 438/29; 438/69

(58) Field of Classification Search
USPC .......... 257/98, E33.061, E31.129; 438/29, 69
See application file for complete search history.

(56) References Cited

U.S. PATENT DOCUMENTS 8,592,829 B2 *  11/2013  Selverian et al. ............... 257/79
2005/0104503 A1  5/2005  Ellens et al.
(Continued)

FOREIGN PATENT DOCUMENTS

DE    102007044556    3/2009
WO    WO 2009/028657    3/2009

OTHER PUBLICATIONS

C. You, LED White Light Visual Equivalence, Fourth International Conference on Solid State Lighting, Proc. of SPIE vol. 5530 (2004) 80-87.

(Continued)

*Primary Examiner* — Su Kim
(74) *Attorney, Agent, or Firm* — Robert F. Clark

(57) ABSTRACT

There is provided a phosphor blend for an LED light source comprising from about 25 to about 35 weight percent of a cerium-activated yttrium aluminum garnet phosphor, from about 5 to about 10 weight percent of a europium-activated strontium calcium silicon nitride phosphor, and from about 50 to about 75 weight percent of a europium-activated calcium magnesium chlorosilicate phosphor. An LED light source in accordance with this invention has a B:G:R ratio for a 5500 K daylight balanced color film of X:Y:Z when directly exposed through a nominal photographic lens, wherein X, Y and Z each have a value from 0.90 to 1.10.

4 Claims, 6 Drawing Sheets

(56) References Cited

U.S. PATENT DOCUMENTS

| | | |
|---|---|---|
| 2006/0214576 A1 | 9/2006 | Takahashi et al. |
| 2007/0170842 A1 | 7/2007 | Bokor et al. |
| 2010/0224895 A1 | 9/2010 | Murazaki et al. |
| 2010/0301777 A1 | 12/2010 | Kraemer |

OTHER PUBLICATIONS

H. Menkara et al., Enhanced Performance of solid state lighting phosphors, Seventh International Conference on Solid State Lighting, Proc. of SPIE vol. 6669 (2007) 66690L-1-66690L-9.

* cited by examiner

PHOSPHOR BLEND FOR AN LED LIGHT SOURCE AND LED LIGHT SOURCE INCORPORATING SAME

CROSS REFERENCES TO RELATED APPLICATIONS

This application claims the benefit of U.S. Provisional Application No. 61/234,525, filed Aug. 17, 2009. This application is related to co-pending application Ser. No. 13/389, 109, filed Feb. 6, 2012.

TECHNICAL FIELD

This invention relates to lighting for photography and cinematography, especially to the use of light emitting diodes (LEDs) for these applications.

BACKGROUND OF THE INVENTION

Lighting for the film industry started with sunlight about the beginning of the last century and thereafter evolved through the carbon arc to a mix of incandescent lamps, medium arc high intensity discharge lamps (e.g., HMI), and more recently, fluorescent lighting. To a greater or lesser extent, these light sources all required large amounts of electric power and generate large amounts of heat that is undesirable during film production. High power consumption is an especially difficult problem for location production where a supply of electric power may be limited unless portable electric generating plants are made available which can increase the cost of production.

In addition, the films that have been developed over the years have been standardized to a degree to have responses based on the spectral characteristics of specific light sources. In particular, two widely used films have based their responses on a incandescent 3200K tungsten source and a standard 5500 K daylight source as exemplified by KODAK Color Negative Film 5219 and KODAK Color Negative Film 5205, respectively. It is important therefore that any new light sources which might be developed for photography or cinematography have appropriate spectral power distributions for use with these films.

SUMMARY OF THE INVENTION

It is an object of the invention to obviate the disadvantages of the prior art.

It is a another object of the invention to provide a light source based on LEDs with the major objectives of reducing heat in the vicinity of the light sources and, more importantly, reducing the power required to operate such lighting.

It is a further object of the invention to provide a light source having a spectral power distribution appropriate for a 5500 K daylight balanced color film.

In accordance with an aspect of the invention, there is provided a phosphor blend for an LED light source comprising from about 25 to about 35 weight percent of a cerium-activated yttrium aluminum garnet phosphor, from about 5 to about 10 weight percent of a europium-activated strontium calcium silicon nitride phosphor, and from about 50 to about 75 weight percent of a europium-activated calcium magnesium chlorosilicate phosphor.

Preferably, the phosphor blend comprises from about 28 to about 32 weight percent of the cerium-activated yttrium aluminum garnet phosphor, from about 6 to about 8 weight percent of the europium-activated strontium calcium silicon nitride phosphor, and from about 60 to about 65 weight percent of the europium-activated calcium magnesium chlorosilicate phosphor.

More preferably, the phosphor blend comprises about 30 weight percent of the cerium-activated yttrium aluminum garnet phosphor, about 7 weight percent of the europium-activated strontium calcium silicon nitride phosphor, and about 63 weight percent of the europium-activated calcium magnesium chlorosilicate phosphor.

In accordance with another aspect of the invention, there is provided an LED light source having a B:G:R ratio for a 5500 K daylight balanced color film of X:Y:Z when directly exposed through a nominal photographic lens, wherein X, Y and Z each have a value from 0.90 to 1.10.

DETAILED DESCRIPTION OF THE INVENTION

In a preferred embodiment, the LED light source comprises either discrete LED elements or arrays of nominally identical elements that can be arranged in various ways to form a complete light source. The color quality as described by the spectral power distribution is balanced to satisfy the exposure requirements of 5500 K daylight balance film as exemplified by KODAK Color Negative Film 5205 although the LED source generally will function satisfactorily with other films nominally balanced for 5500 K daylight. The sine qua non is that non-selectively reflecting surfaces will be reproduced achromatically by the developed film. It will be noted that trichromatic films of this type cannot ever reproduce all possible colored reflective surfaces identically to their direct visual appearances irrespective of the light source spectral power distribution that is used. This well-known limitation is described in Kodak Publication No. E-73, *Why a Color May Not Reproduce Correctly* (312-10-78-DX, 1978).

5500 K daylight film is nominally balanced to give proper color reproduction with reconstituted daylight at a correlated color temperature (CIE 15:2004) of 5500 K. Reconstituted daylight (CIE 15:2004) is a form of averaged daylight expressed as a spectral power distribution. However, certain spectral power distributions that differ from this one can be made acceptable. Note that an acceptable alternative does not necessarily have to have a correlated color temperature of 5500 K. Regardless of the actual correlated color temperature of the LED source, it is identified as a 5500 K photographic light indicating that it is to be used with 5500 K daylight balanced film. Further, it is well-known that handheld photographic color temperature meters may not indicate either 5500 K or the actual correlated color temperature of the LED source. The light does not have to have any particular visual appearance in terms of color quality, and it does not have to meet any particular color quality metric for visual purposes. Parenthetically, we will note that the General Color Rendering Index (CIE 13.3-1995) of an acceptable light for this application commonly will fall in an acceptable range of values for commercial lighting lamps, i.e., roughly 70 or higher. The basic requirement is that the photographic system reproduces color in a proper and acceptable manner.

Figure 1:
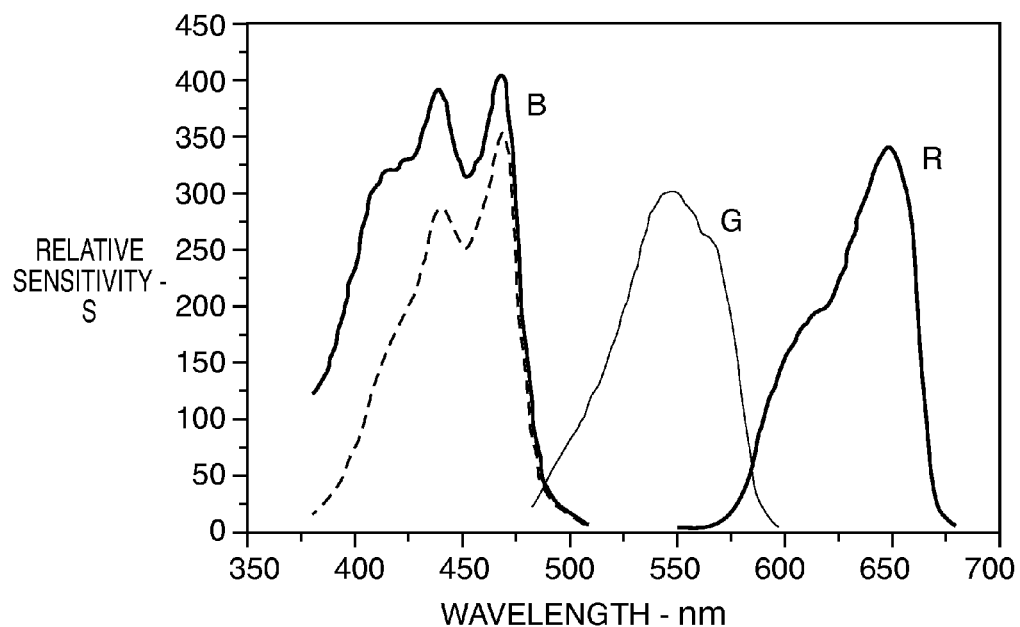
FIG. 1 illustrates the three film response sensitivities for 5500 K daylight film.

The method for designing the light source is to control three metric values proportional to the three components of the film response when the film is directly exposed to the light source spectrum. The three components are called the blue (B), green (G), and red (R) responses because the three film component sensitivities fall in the regions of the spectrum that are so described. FIG. 1 illustrates the three film response sensitivities. We observe that the sensitivities of all three components are reasonably similar.

Figure 2:
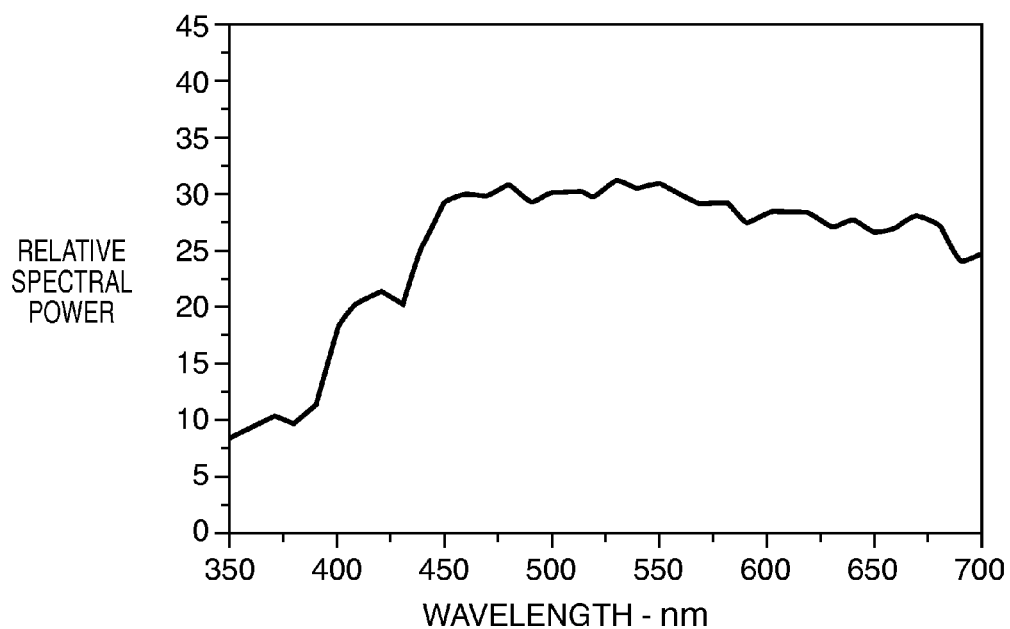
FIG. 2 shows the relative spectral power distribution of 5500 K reconstituted daylight.

FIG. 2 shows the relative spectral power distribution of 5500 K reconstituted daylight. When this spectral power is independently weighted by each of the three spectral sensitivities, the resulting blue (B), green (G), and red (R) responses are proportional to the areas under the respective product curves. The necessary condition for the required achromatic reproduction of a non-selectively reflecting surface is that B:G:R is in the proportions of 1:1:1. This establishes the "white point" for the film exposure. We note that the spectral power of the 5500 K daylight is reasonably constant across the visible spectrum, a lack of variation that is similar to that of the areas under the three sensitivity curves versus wavelength. Clearly the balance of film sensitivities has been set to give three equal responses under a 5500 K daylight light source.

Figure 3:
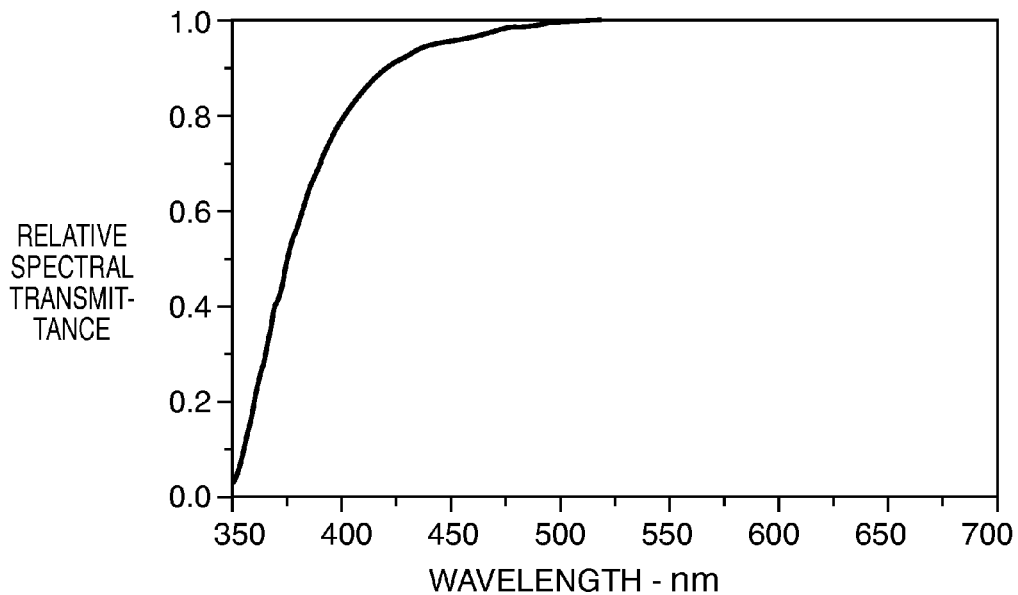
FIG. 3 shows the average lens spectral transmittance used in the standard ANSI PH2.3-1972.

As an essential component of the computation for the desired light source spectral distribution, note that the blue sensitivity of the film extends below 400 nm into the ultraviolet region of the spectrum. If the design were to proceed with the inherent blue film sensitivity, nonvisible radiation would influence the white point balance. But we also note that photographic lenses attenuate short wavelength radiation to a greater or lesser extent in the ultraviolet and sometimes well into the violet and blue regions of the visible spectrum. The effect depends on the various glasses used in manufacturing of a particular photographic camera lens and on the various lens coatings commonly used to reduce surface reflections at the various glass surfaces within the lens. The best we can do when designing a photographic light source to be used with a particular film is to make an average correction that is reasonably representative for most lenses. In this instance, we select the average lens spectral transmittance that is used in the standard ANSI PH2.3-1972. This lens transmittance (see FIG. 3) greatly reduces the blue response of the film to UV in a light source. The product of the blue film sensitivity and the typical average lens transmittance results in an effective blue film response as shown by the dashed line in FIG. 1. It is this modified blue response that is used in the LED design process. If the lens transmittance did not attenuate in the visible spectrum, this would be a moot point for the LED system in which the LED system does not radiate in the ultraviolet. However, the attenuation in the blue end of the visible spectrum above 400 nm will affect the white point balance.

The final acceptance of an LED or most other types of light sources for photography and cinematography cannot be set by computational or measurement means. It anticipated and expected that each light will have minor and subtle effects on the film exposure. These only can be determined by film tests using the actual or typical scenes. The lighting director will look at the resulting photography and make a decision of acceptability. If it is not quite to his liking, a weak color compensating and/or light balancing filter will be placed in front of the light. At the same time another lighting director may prefer the light without the filter(s) rather than the light changed by the filter. Because this is an issue of human preference, we do not expect universal agreement on the exact characteristics of a preferred light. Other issues such as the variation of any particular lens from the average typical lens transmittance will have a small effect on the performance of the light interacting with the film response. Many other minor factors are known and controlled to a greater or lesser extent. Examples of such factors would be deviations in the particular batch of film stock, the developing process, nonlinearities in the photographic process, etc. Consequently, some small variation in the B:G:R ratio characterizing an acceptable light source is expected and will not be significant providing that it is not excessive. When making final evaluative judgments of the color balance, there may be small displacements in the target design ratio due to such factors as the blue cutoff of the actual lens used in the evaluation.

What we have invented is a phosphor blend and an LED light source designed for use in conjunction with color film balanced for 5500 K average daylight. The ratio of the three color components of the film, B:G:R, when directly exposed through a nominal photographic lens, is 1:1:1. The acceptable variability for this invention is defined at ±20% for each of the three numerical values. Preferably, the LED light source has a B:G:R ratio for a 5500 K daylight balanced color film of X:Y:Z when directly exposed through a nominal photographic lens, wherein X, Y and Z each have a value from 0.90 to 1.10.

Figure 4:
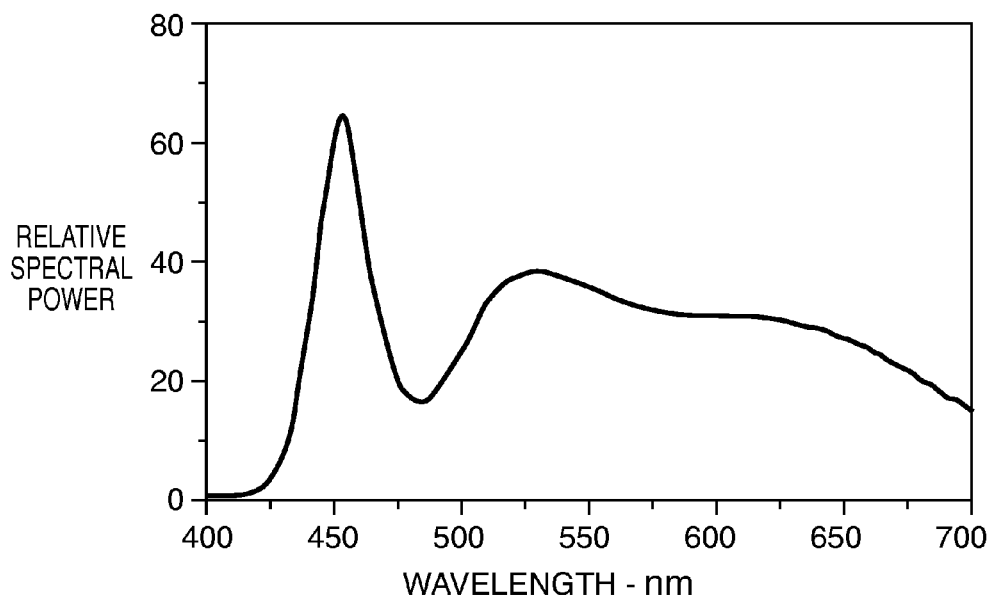
FIG. 4 shows a spectrum of an embodiment of an LED light source according to this invention for use with 5500 K daylight balanced color film.

FIG. 4 shows an exemplary LED light source according to an embodiment of this invention for use with 5500 K daylight balanced color film. The B:G:R ratio is 1.00:1.13:1.03. While visible metrics are irrelevant for this invention in its intended application, such values may aid in visualizing this light source. The correlated color temperature is 5690 K while the general color rendering index is 93. In a preferred embodiment, the LED sources use blue-emitting LED chips with phosphor embedded domes that provide the full required spectral range. Blue-emitting LEDs with dominate wavelengths in the range of 455-465 nm are typically used and the phosphor embedded domes contain a three-component blend of phosphors.

The three phosphor components in the blend include (1) a europium-activated calcium magnesium chlorosilicate phosphor, preferably having a composition represented by the formula, $Ca_8Mg(SiO_4)_4Cl_2:Eu^{2+}$, and having a peak emission at about 500-510 nm; (2) a europium-activated strontium calcium silicon nitride phosphor, preferably having a composition represented by the formula, $Sr_{2-x}Ca_xSi_5N_8:Eu^{2+}$, and having a peak emission at about 655-665 nm; and (3) a cerium-activated yttrium aluminum garnet phosphor, preferably having a composition represented by the formula, $Y_3Al_5O_{12}:Ce^{3+}$, and having a peak emission at about 560-570 nm. The preferred phosphor blend in Table I was developed to couple with the spectral response of common daylight balanced films. Depending on the geometry of the part containing the phosphor blend (dome volume converted package) the concentration of the phosphor blend in the silicone matrix will vary. Typical values are 5-10 weight percent (wt %) phosphor blend in the silicone matrix.

Table I

| Phosphor | Wt % | Phosphor dominant wavelength (nm) |
|---|---|---|
| $Y_3Al_5O_{12}:Ce^{3+}$ | 30.0 | 573 |
| $Sr_{2-x}Ca_xSi_5N_8:Eu^{2+}$ | 6.75 | 608 |
| $Ca_8Mg(SiO_4)_4Cl_2:Eu^{2+}$ | 63.25 | 524 |

Figure 5:
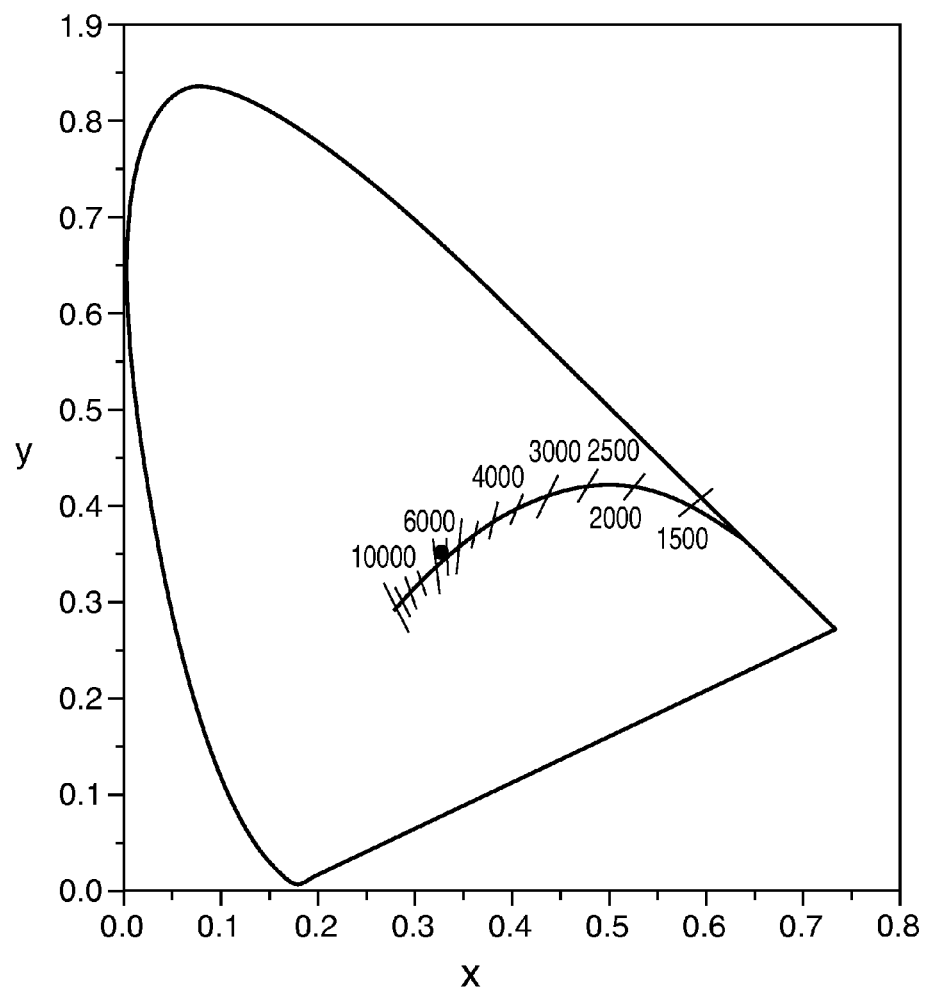
FIG. 5 shows the chromaticity point of the LED light source on the 1931 CIE Chromaticity Diagram.
Figure 6:
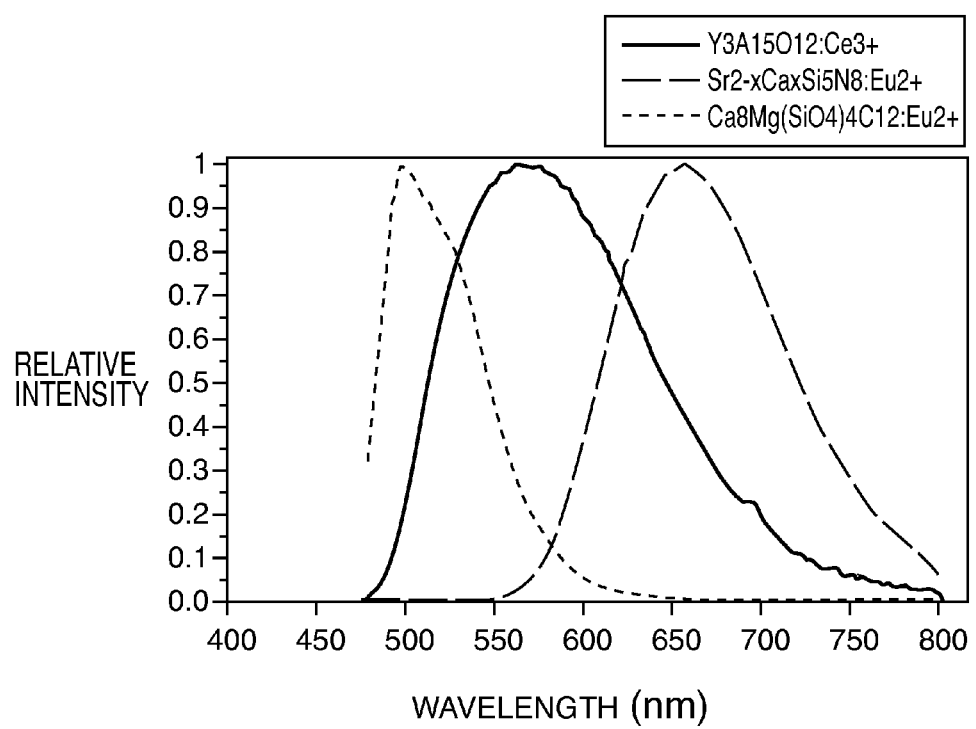
FIG. 6 shows the individual emission curves for the three phosphors comprising the phosphor blend according to this invention.

FIG. 5 shows the chromaticity point of the LED light source on the 1931 CIE Chromaticity Diagram where correlated color temperature lines are labeled in kelvin. The chromaticity, the correlated color temperature, and the general color rendering index are not given tolerances because they are dependent variables; B, G, and R are the independent variables. FIG. 6 shows the individual emission curves for the three phosphors comprising the blend. The phosphors are excited by the blue light emission from the blue LED and the light emitted by the phosphors combines with the remaining blue emission from the LED to produce the desired spectral output.

Figure 7:
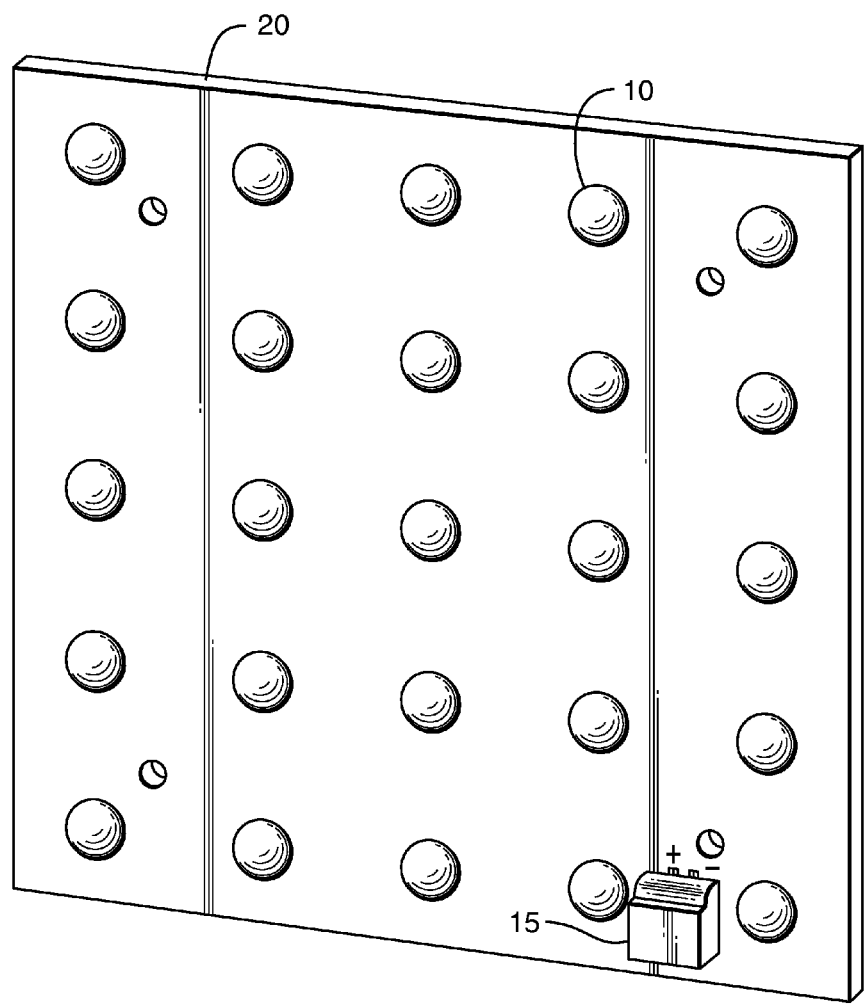
FIG. 7 is a top view of an array of LED light sources according to this invention.
Figure 8:
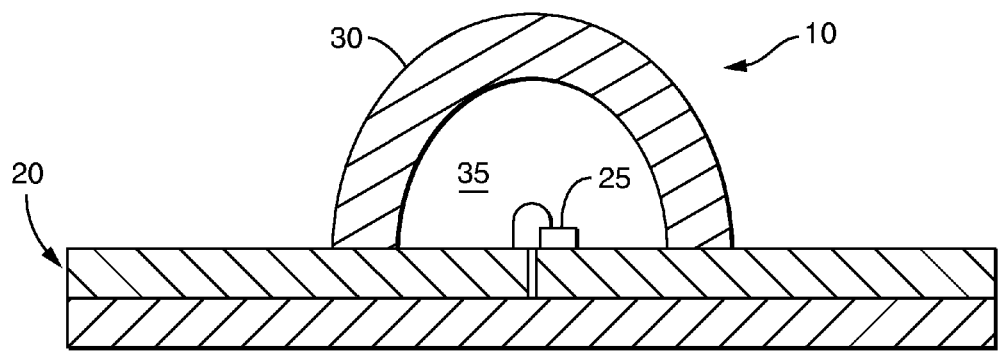
FIG. 8 is a cross-sectional illustration of one of the LED light sources shown in FIG. 7.

FIG. 7 is a top view of an array of LED light sources according to this invention. The LED light sources 10 are mounted on a circuit board 20 in a 5×5 array. The circuit board 20 is fitted with an electrical connector 15 for supplying power to the LED light sources. A cross-sectional illustration of one of the LED light sources 10 is shown in FIG. 8. The LED die 25 is mounted to the circuit board 20 and is covered by a phosphor-filled dome 30. The dome contains the 3-component phosphor blend. The space 35 between the LED die 25 and the dome 30 is preferably filled with a transparent silicone resin.

While there have been shown and described what are at present considered to be preferred embodiments of the invention, it will be apparent to those skilled in the art that various changes and modifications can be made herein without departing from the scope of the invention as defined by the appended claims.

We claim:

1. A phosphor blend for an LED light source comprising from about 25 to about 35 weight percent of a cerium-activated yttrium aluminum garnet phosphor, from about 5 to about 10 weight percent of a europium-activated strontium calcium silicon nitride phosphor, and from about 50 to about 75 weight percent of a europium-activated calcium magnesium chlorosilicate phosphor.

2. The phosphor blend of claim 1 wherein the blend comprises from about 28 to about 32 weight percent of the cerium-activated yttrium aluminum garnet phosphor, from about 6 to about 8 weight percent of the europium-activated strontium calcium silicon nitride phosphor, and from about 60 to about 65 weight percent of the europium-activated calcium magnesium chlorosilicate phosphor.

3. The phosphor blend of claim 1 wherein the blend comprises about 30 weight percent of the cerium-activated yttrium aluminum garnet phosphor, about 7 weight percent of the europium-activated strontium calcium silicon nitride phosphor, and about 63 weight percent of the europium-activated calcium magnesium chlorosilicate phosphor.

4. The phosphor blend of claim 1 wherein the cerium-activated yttrium aluminum garnet phosphor has a composition represented by a formula $Y_3Al_5O_{12}:Ce^{3+}$, the europium-activated strontium calcium silicon nitride phosphor has a composition represented by a formula, $Sr_{2-x}Ca_xSi_5N_8:Eu^{2+}$, and the europium-activated calcium magnesium chlorosilicate phosphor has a composition represented by a formula $Ca_8Mg(SiO_4)_4Cl_2:Eu^{2+}$.

* * * * *